US010795606B2

(12) United States Patent
Carter

(10) Patent No.: US 10,795,606 B2
(45) Date of Patent: *Oct. 6, 2020

(54) BUFFER-BASED UPDATE OF STATE DATA

(71) Applicant: Hewlett Packard Enterprise Development LP, Houston, TX (US)

(72) Inventor: Richard J. Carter, Los Altos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/059,295

(22) Filed: Aug. 9, 2018

(65) Prior Publication Data

US 2018/0349058 A1 Dec. 6, 2018

Related U.S. Application Data

(63) Continuation of application No. 15/316,867, filed as application No. PCT/US2014/044721 on Jun. 27, 2014, now Pat. No. 10,067,715.

(51) Int. Cl.
*G06F 3/06* (2006.01)
*G06F 13/00* (2006.01)
*G06F 30/20* (2020.01)
*G06F 9/52* (2006.01)

(52) U.S. Cl.
CPC .......... *G06F 3/0656* (2013.01); *G06F 3/0604* (2013.01); *G06F 3/064* (2013.01); *G06F 3/0683* (2013.01); *G06F 13/00* (2013.01); *G06F 30/20* (2020.01); *G06F 9/526* (2013.01)

(58) Field of Classification Search
CPC ...... G06F 3/0604; G06F 3/064; G06F 3/0656; G06F 3/0683

USPC ......................................................... 711/156
See application file for complete search history.

(56) References Cited

U.S. PATENT DOCUMENTS

| | | | |
|---|---|---|---|
| 5,133,045 | A | 7/1992 | Gaither et al. |
| 5,977,989 | A | 11/1999 | Lee et al. |
| 6,100,906 | A | 8/2000 | Asaro et al. |
| 6,795,078 | B2 | 9/2004 | Lavelle et al. |
| 7,262,776 | B1 | 8/2007 | Wilt et al. |
| 7,937,114 | B2 | 5/2011 | Yamagishi |

(Continued)

OTHER PUBLICATIONS

International Search Report and Written Opinion, Application No. PCT/US2014/044721 dated Feb. 26, 2015, 10 pages.

(Continued)

*Primary Examiner* — Than Nguyen

(57) ABSTRACT

Example implementations relate to buffer-based update of state data. In example embodiments, a computing device may obtain current state data from a first buffer and determine next state data based at least on the current state data. The computing device may also obtain last difference data that corresponds, for example to current state data that is different from previous state data. The last difference data may be obtained, for example, using a difference data identifier. The computing device may store the last difference data in the second memory buffer. The computing device may also store in the second memory buffer new difference data corresponding to differences between the next state data and the current state data. The computing device may also update the difference data identifier based on the new difference data.

18 Claims, 3 Drawing Sheets

(56) References Cited

U.S. PATENT DOCUMENTS

| | | | |
|---|---|---|---|
| 8,700,570 | B1 | 4/2014 | Marathe et al. |
| 10,067,715 | B2* | 9/2018 | Carter ................. G06F 17/5009 |
| 2003/0080963 | A1 | 5/2003 | Van et al. |
| 2004/0117571 | A1* | 6/2004 | Chang ..................... G06F 9/465 |
| | | | 711/162 |
| 2004/0179019 | A1 | 9/2004 | Sabella et al. |
| 2007/0028037 | A1 | 2/2007 | Kang |
| 2007/0297433 | A1 | 12/2007 | Lin et al. |
| 2009/0002384 | A1 | 1/2009 | Yamagishi |
| 2012/0072674 | A1 | 3/2012 | Pierson et al. |
| 2012/0137098 | A1 | 5/2012 | Wang et al. |
| 2013/0346647 | A1 | 12/2013 | Carrick et al. |
| 2017/0351429 | A1* | 12/2017 | Dimitrov ................ H03M 7/60 |

OTHER PUBLICATIONS

Wang, G., "Synchronous Reactive Communication: Generalization, Implementation, and Optimization", Research Paper, Dec. 19, 2008, 198 pages.

\* cited by examiner

BUFFER-BASED UPDATE OF STATE DATA

PRIORITY INFORMATION

This application is a continuation of U.S. National Stage application Ser. No. 15/316,867 filed on Dec. 7, 2016, which claims priority to International Application No. PCT/US2014/044721 filed on Jun. 27, 2014. The contents of which are incorporated herein by reference in its entirety.

BACKGROUND

Computers can perform system simulations and real-time system control by considering time discretely. For example, a computer can maintain a memory of the system's state at a given point in time, and update the state in small time increments, determining the next state based on the current state and any additional inputs. Some systems, such as systems for climate simulation or face recognition, may require vast amounts of data to accurately represent their state.

BRIEF DESCRIPTION OF THE DRAWINGS

The following detailed description references the drawings, wherein.

DETAILED DESCRIPTION

Figure 1:
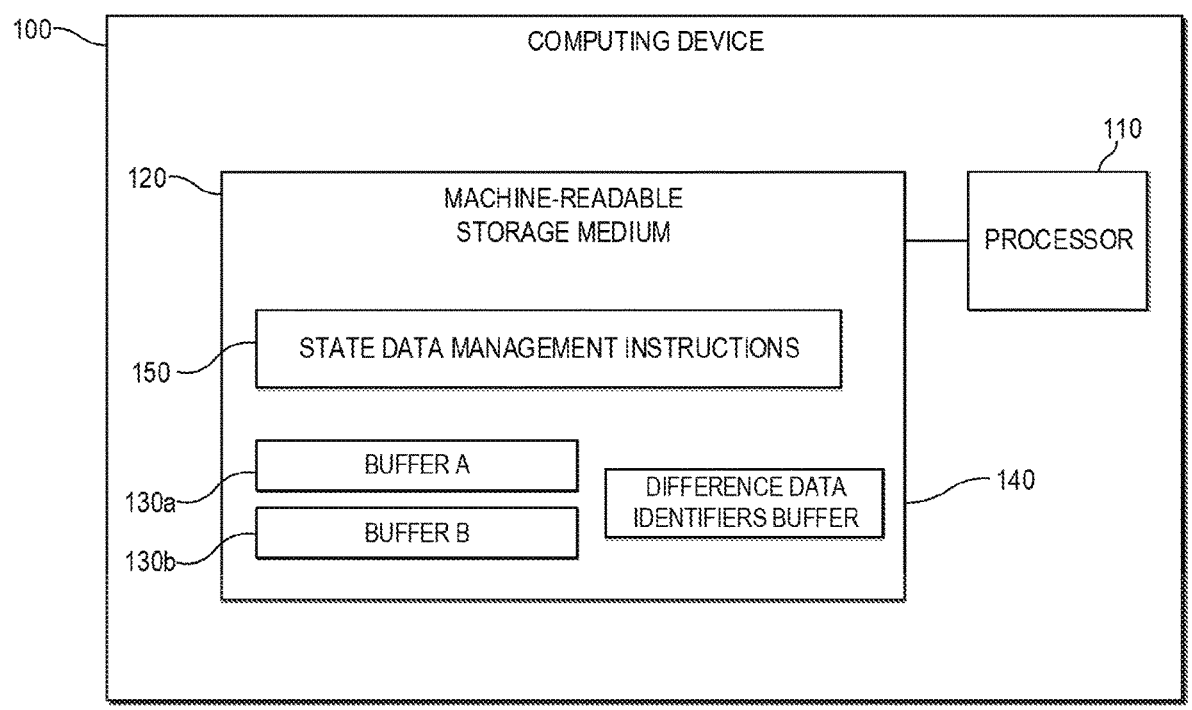
FIG. 1 is a block diagram of an example computing device, consistent with implementations of the present disclosure.

As detailed above, computers may perform simulations and real-time system control by maintaining and updating state data describing the system's state. As the systems become more complex, however, the amount of data required to accurately represent their states increases dramatically. To maintain and process large amounts of data efficiently, a computer may break the state data into portions and process each portion independently. Processing efficiency can also be increased by processing the state data using a number of processors operating in parallel, where each processor may independently process current state data (e.g., state data that is currently stored in memory) and output a different portion of next state data, where the different portions may have some overlap.

Such distributive processing techniques, however, may be prone to data corruption if only one copy of state data is maintained in memory. For example, if a processor calculates and outputs a portion of next state data overwriting some current state data, another or same processor may subsequently read the overwritten data, incorrectly treating it as current state data. To ensure correct and deterministic state transitions, a double-buffering scheme may be employed, where a first memory buffer may hold the system state, for example, for all the even-numbered states, and the second memory buffer may hold the system state for all the odd-numbered states. When computing an odd-numbered state, one or more processors may read from the first memory buffer and write to the second memory buffer, and when computing an even-numbered state, the processors may read from the second memory buffer and write to the first memory buffer. This way, data coherency can be ensured even if various portions of the state data are processed in a non-deterministic order.

However, in such double-buffered configurations, if the processor(s) output and store only those portions of the next state data that are different from the current state data, the memory buffer serving as the output buffer may not end up accurately representing the next state, even if both buffers are initialized identically, because it may not reflect the differences between the current state data and the previous state data, since those differences were only stored in the other buffer, currently serving as the input buffer. One way to avoid this is to always output the entire next state data, and not just state data that has changed from the current state to the next state. However, writing the entire state data at each state transition may be a time- and resource-consuming task, particularly for systems represented by large state data sizes, systems requiring fast state updates, or both.

Example implementations disclosed herein relate to buffer-based update of state data. In example implementations, a computing device may obtain current state data from a first buffer and determine next state data based at least on the current state data. The computing device may also obtain last difference data that corresponds, for example to current state data that is different from previous state data. The last difference data may be obtained, for example, using a difference data identifier. The computing device may store the last difference data in the second memory buffer. The computing device may also store in the second memory buffer new difference data corresponding to differences between the next state data and the current state data. The computing device may also update the difference data identifier based on the new difference data.

In this manner, example implementations disclosed herein ensure data coherency during state transitions, without requiring that entire state data is copied at each transition. Example implementations thereby increase system performance, minimize system's hardware and/or software requirements, reduce system's cost and power consumption, and so forth. Additional implementations and advantages of such implementations will be apparent to those of skill in the art upon reading and understanding the following description.

Referring now to the drawings, FIG. 1 is a block diagram of an example computing device 100. While schematically shown as a single device, it is appreciated that computing device 100 may include one or more computing devices, such as electronic devices, bio-computers, or other devices capable of performing the functionality discussed below. For example, computing device 100 may include any combination of one or more electronic devices such as server computers, desktop computers, notebook computers, tablet computing devices, mobile phones, or any other suitable electronic devices. In the example implementation of FIG. 1, electronic device 100 includes processor 110, and machine-readable storage medium 120.

Processor 110 may include one or more processing units, such as central processing units (CPUs), graphics processing units (GPUs), microprocessors, and/or other hardware devices suitable for retrieval and execution of instructions stored, for example, in machine-readable storage medium 120. For example, processor 110 may fetch, decode, and execute buffer-based state data update instructions 150, as described above. As an alternative or in addition to retrieving, decoding, and executing instructions, processor 110 may include one or more electronic circuits comprising a number of electronic components for performing buffer-based state data update instructions 150. In some implementations, the one or more processing units and/or electronic circuits may be configured to operate in parallel to perform buffer-based state data update instructions 150.

Machine-readable storage medium 120 may be, for example, one or more electronic, magnetic, optical, or other physical storage devices that may store executable instructions. Thus, machine-readable storage medium 120 may include, for example, Random Access Memory (RAM), an Electrically-Erasable Programmable Read-Only Memory (EEPROM), a flash memory, a memristor-based memory, a storage drive, an optical disc, and the like. Accordingly, machine-readable storage medium 120 may include volatile memory and/or non-volatile memory. In some examples, machine-readable storage medium 120 may be a non-transitory storage medium, where the term "non-transitory" does not encompass transitory propagating signals. Machine-readable storage medium 120 may store, among other things, buffer-based state data update instructions 150 and buffers 130a, 130b, and 140 used by buffer-based state data update instructions 150, as discussed below.

Figure 2:
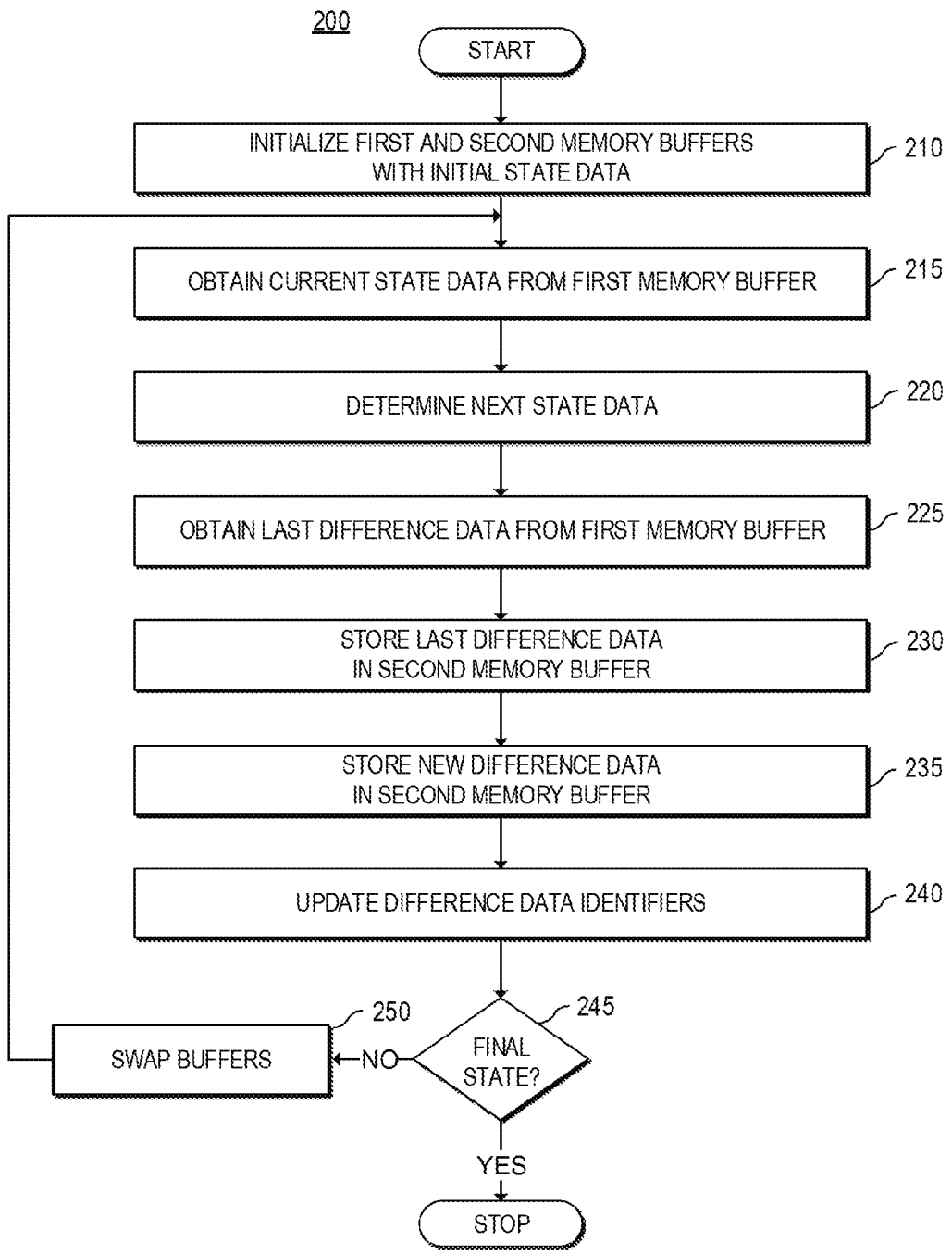
FIG. 2 is a flowchart of an example method for buffer-based update of state data, consistent with implementations of the present disclosure.

FIG. 2 is a flowchart representing an example method 200 for buffer-based update of system state data. While the flowchart discloses the following blocks in a particular order, it is appreciated that at least some of the blocks may be moved, modified, or deleted where appropriate, consistent with the teachings of the present disclosure. Method 200 can be performed by one or more computing devices, such as computing device 100. Method 200 may be implemented in the form of instructions, such as state data update instructions 150, which may be stored on a machine-readable storage medium, such as machine-readable storage medium 120, and executable by a processor, such as processor 110. Alternatively or in addition, method 200 may be implemented in part or in its entirety in the form of electronic circuitry.

At block 210, computing device 100 may initialize a first memory buffer and a second memory buffer with initial state data. In some implementations, the first and second memory buffers may include memory buffers 130a and 130b stored in machine-readable storage medium 120 of computing device 100. In other implementations, one or both of the first and second memory buffers may be stored on another device, such as a network server, which may be remotely accessible by computing device 100. Each memory buffer may be stored entirely on a single device or over a number of devices, and may be implemented in the form of any type of data structure allowing storage, retrieval, and update of a plurality of values. For example, the memory buffers may be implemented as one-dimensional arrays, two-dimensional arrays, multi-dimensional arrays, trees, heaps, linked lists, database tables, and the like.

Each memory buffer may store, among other things, state data describing a given state of a given system, such as a system being simulated or controlled by computing device 100. State data may include, for example, a plurality of values that describe the system state. For example, if the system is a climate system, the plurality of values may include temperatures, wind speeds, humidity levels, and other climate parameters associated with one or more geographical areas. Each of the plurality of values describing the system state may be stored at a specific location within the memory buffer. Each location may be described by an identifier, which may be an address, such as an absolute memory address (e.g., an absolute address within machine-readable storage medium 120) or a relative memory address (e.g., an offset within the respective memory buffer). An identifier may also include an index value, or any other type of information identifying a particular value within the memory buffer and thereby allowing computing device 100 to store, retrieve and/or update the particular value.

Initializing the first and second memory buffers with initial state data in block 210 may include writing to or storing in each of the memory buffers identical initial state data that may include a plurality of predetermined or default values. The initialization may also include designating one of the memory buffers as the first memory buffer and the other memory buffer as the second memory buffer. In some implementations, the initial designation may be arbitrary, and the designation may be dynamically changed by computing device 100, as discussed below.

At block 215, computing device 100 may obtain current state data from the first memory buffer, that is, the memory buffer that is currently designated as the first memory buffer. Computing device 100 may read from the first memory buffer all current state data, or, in some implementations, only that portion of current state data that may be used for determining the next state data.

At block 220, computing device 100 may determine next state data based at least on the current state data. For example, in case of a climate system simulation, computing device 100 may determine, based on climate data a "current" point in time (which can be in the past, present, or future), climate data at a next point in time, which can be, for example, a predetermined time period (e.g., a second, a minute, a day, etc.) after the current point in time. In some implementations, computing device 100 may use one or more models, such as a climate model, for determining next state data based on current state data.

In some implementations, computing device 100 may determine next state data based on current state data and one or more additional inputs, such as user inputs or real-time sensor inputs such as image sensors, audio sensors, motion sensors, and the like. In these implementations, computing device 100 may wait for additional inputs to be obtained before proceeding to determine next state data.

For some systems, such as climate or face recognition systems, computing device 100 may need to read most or all of current state data to determine next state data, but the determined next state data may have a limited number (e.g., less than 10% or less than 1%) of changes or differences relative to current state data. Therefore, in some implementations, determining next state data may include determining only the differences between the current state data and the next state data. Hereinafter, the portion of state data that changes between two subsequent states may be referred to as "difference data," and state data that does not change between two subsequent states may be referred to as "unchanged data."

At block 225, computing device 100 may obtain last difference data, i.e., any portion of state data that changed from the previous state to the current state. It is appreciated that difference data may sometimes include no data, for example, if the current state is the first state, or when the last state data was identical to the current state data. In some implementations, computing device 100 may obtain last difference data from the first memory buffer by first obtaining one or more difference data identifiers that identify one or more locations of the last difference data in the memory buffer.

Difference data identifiers may be stored in a buffer, such as difference data identifiers buffer 140, which may be stored in machine-readable storage medium 120 of computing device 100 or on another device remotely accessible by computing device 100. Difference data identifiers buffer 140 may be implemented, for example, using any data structure suitable for storing a plurality of values, such as a one-dimensional array, a linked list, and the like. Difference data identifiers may identify individual addresses and/or ranges of addresses at which difference data is stored in the memory buffer. In some implementations, if difference data identifiers include regions, the regions may include data other than difference data. For example, if the memory buffer is a two-dimensional N×M array and difference data is scattered across the array, difference data identifiers may identify one or more windows within the N×M array that include difference data and potentially some unchanged data. An identifier may identify its respective window, for example, by identifying the window's opposite corners or one of the window's corner and the window's dimensions. While some additional writing or storing operations may be required due to potential inclusion of unchanged data in the regions, storing region identifiers may reduce the amount of memory required for identifying the difference data.

In some implementations, computing device 100 may obtain difference data addresses directly from the first memory buffer without first obtaining difference data identifiers. For example, if the first memory buffer is implemented using a data structure that supports flagging recently changed data, computing device 100 can directly read from the first memory buffer any recently changed data that may correspond to last difference data. In some implementations, instead of obtaining last difference data from the first memory buffer, computing device 100 may obtain last difference data from another buffer that may, for example, temporarily store a copy of last difference data.

At block 230, computing device 100 may store the obtained last difference data, if any, in the second memory buffer. For example, computing device 100 may write the last difference data to one or more corresponding locations in the second memory buffer. In some implementations, the first and the second memory buffers may have a similar or identical structure (e.g., both can be one-dimensional arrays of similar size), in which case computing device 100 may store the last difference data in the second memory buffer at locations corresponding to the last difference data's locations in the first memory buffer, for example, at the same offset addresses, at the same indexes, and so forth. In some implementations, in block 230, computing device may store last difference data only, without storing any data that has not changed from the last state to the current state. In other implementations, some unchanged data may be stored along with last difference data, for example, due to range identifiers discussed above and/or because computing device 100 may have a minimum storage unit (e.g., 128 bytes) in which case storing a portion of last difference data that is smaller than the minimum storage unit may require storing some unchanged data, as well. It is appreciated, however, that even if some amount of unchanged data is stored at block 230 due to overheads, that amount may be limited and, for example, may not exceed the amount of last difference data.

At block 235, computing device 100 may store in the second memory buffer new difference data—the portion of the determined next state data that is different from the current state data. Computing device may store new difference data only, without storing some or any data that has not changed from the current state to the next state. As discussed above, not having to store most (e.g., more than 50%) or all of unchanged next state data may save numerous write operations, thereby increasing performance, reducing system costs and power consumption, etc.

As mentioned above, while the flowchart discloses the blocks of method 200 in a particular order, it is appreciated that at least some of the blocks may be moved, modified, or deleted where appropriate, consistent with the teachings of the present disclosure. For example, computing device 100 may perform blocks 225 and 230 before or in parallel to performing blocks 215 and 220. In some implementations, however, computing device 100 may begin performing block 235 for storing new difference data only after it finishes storing all last difference data in block 230. Because of a potential overlap between new difference data and last difference data (i.e., where some data changed from the previous state to the current state and then changed again from the current state to the next state) writing new difference data after last difference data may prevent last difference data from overwriting new difference data.

At block 240, computing device 100 may update difference data identifiers based on the new difference data stored in block 235. For example, computing device may store in difference data identifiers buffer 140 one or more identifiers that identify where new difference data was stored in the second memory buffer. As discussed above, difference data identifiers may identify the location of the difference data in the memory buffer by specifically identifying each address or index at which difference data is stored in the memory buffer and/or by identifying regions (e.g., one-dimensional regions or two-dimensional windows) within the memory buffer that include difference data.

While block 240 follows block 235 in the flowchart, it is appreciated that computing device 100 may not need to finish storing new difference data before beginning to update difference data identifiers. For example, in some implementations, difference data identifiers may be updated with new difference data as soon as last difference data has been stored, and next state data has been determined.

In some implementations, difference data identifiers buffer 140 may be implemented as a double buffer, allowing computing device 100 to store last difference data identifiers in one buffer, and new difference data identifiers in another buffer. In these implementations, computing device 100 may not need to wait for last difference data to be stored in block 235 before updating difference data identifiers buffer 140 with identifiers corresponding to new difference data.

At block 245, computing device 100 may determine whether the next state for which next state data was determined in block 220 is the final state of the system, and if so, method 200 may end. Otherwise, method 200 may proceed to block 250 where computing device 100 may swap the first and second memory buffers, for example, by re-designating the first memory buffer as the second memory buffer, and by re-designating the second as the first memory buffer. From block 250, the method may then proceed to block 215.

As mentioned above, method 200 may include additional blocks, not shown in FIG. 2 for reasons of brevity. For example, after computing device 100 determines next state data, computing device 100 may display next state data on a display coupled to computing device 100, and/or store the next state data (or only new difference data), for example, into a file. In some implementations, computing device 100 may provide for display a graphical user interface (GUI) through which computing device 100 may, for example, present state data to the user and receive user inputs. As discussed above, in some implementations, user inputs may be used by computing device 100 in determining next state data. Additionally, user inputs may be used to pause execution of method 200, "rewind" method 200 backward or forward, and otherwise control the execution of method 200. The GUI may be provided by computing device 100 on a display physically or remotely coupled to computing device 100.

Method 200 can be further illustrated by an example in FIGS. 3A-3F, showing example contents of buffers 130a, 130b, and 140, as they change during execution of method 200. As discussed above, while some blocks of method 200 are described as being performed in a particular order, it is appreciated that in some implementations the order may be modified.

Figure 3A:
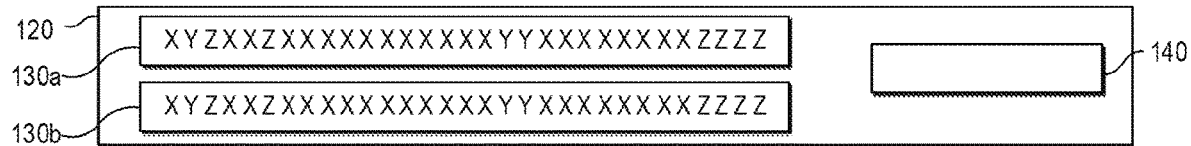
FIGS. 3A-3F are partial block diagrams of an example machine-readable storage medium, consistent with implementations of the present disclosure.

In the example of FIG. 3A, buffers 130a and 130b are initialized (210) to store initial state data, symbolically indicated by characters 'X', 'Y,' and 'Z.' Buffer 130a is initially designated as the first memory buffer and buffer 130b is initially designated as the second memory buffer. Buffer 140 is initialized to contain no last difference data identifiers because last difference data is not available at this initial state.

Next, current state data is obtained (215) from the first memory buffer, currently buffer 130a. Based on the obtained current state data (and, in some implementations, based also on additional inputs) next state data is determined (220). In this example, next state data is determined to be different from current state data by two values, which are symbolically indicated by "A" and "B," and which constitute new difference data in this case.

Next, last difference data is obtained (225) from first memory buffer and stored (230) in second memory buffer, currently buffer 130b. At this stage, there is no last difference data, as indicated by an empty difference data identifiers buffer 140.

Figure 3B:
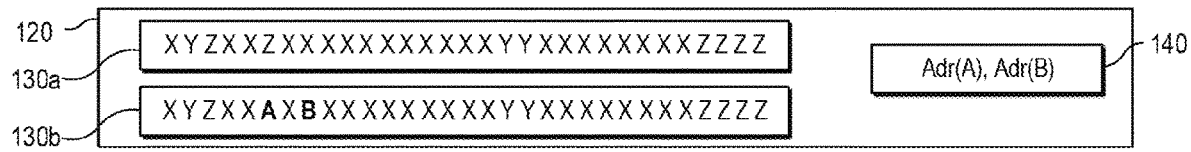

As illustrated in FIG. 3B, new difference data ("A" and "B") is then stored (235) in the second memory buffer, currently buffer 130b, and buffer 140 is updated (240) to include identifiers identifying the new difference data. In this example, the identifiers include two addresses Adr(A) and Adr(B), which may be absolute or relative offset addresses, and which identify the locations of values "A" and "B" within the second memory buffer, currently buffer 130b.

In this example, after updating buffer 140, it is determined (245) that the next state is not the final state. Based on this determination, the first and second memory buffers are swapped (250) to cause the first memory buffer to correspond to buffer 130b and to cause the second memory buffer to correspond to buffer 130a.

Next, current state data is obtained (215) from the first memory buffer, currently buffer 130b, and next state data is determined (220) based at least on the obtained current state data. In this example, next state data includes only one new value, indicated by "C."

Figure 3C:
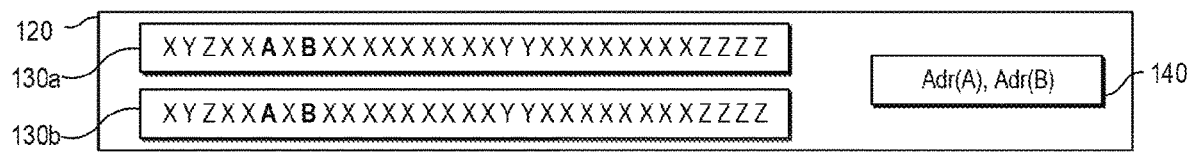

Last difference data is then obtained (225) from the first memory buffer, currently buffer 130b. As discussed above, last difference data may be obtained from the first memory buffer by using last difference data identifiers stored in buffer 140. Accordingly, in this example, identifiers Adr(A) and Adr(B) stored in buffer 140 may be used to obtain last difference data "A" and "B" from the first memory buffer, currently buffer 130b. Last difference data is then stored (230) in the second memory buffer, currently buffer 130a, as shown in FIG. 3C.

Figure 3D:
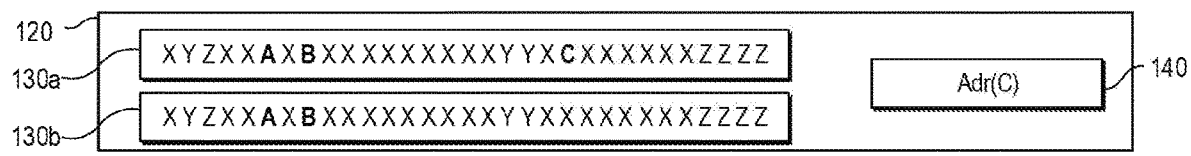

Next, as shown in FIG. 3D, new difference data ("C") is stored (235) in the second memory buffer, currently buffer 130a, and buffer 140 is updated (240) to store identifier Adr(C) identifying the location of new difference data in the second memory buffer. It is then determined (245) that the next state is not the final state, and the first and second memory buffers are swapped (250) again such that the first memory buffer now corresponds to buffer 130a and the second memory buffer now corresponds to buffer 130b.

Figure 3E:
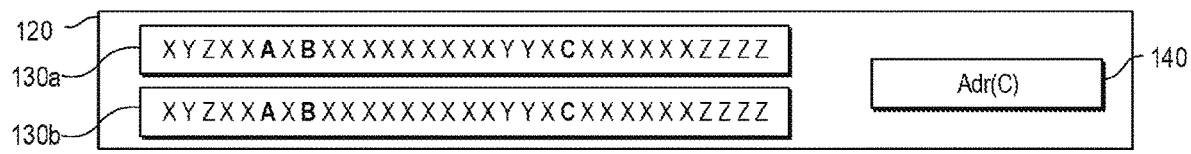

Next, current state data is obtained (215) from the first memory buffer, currently buffer 130a, and next state data is determined (220) based at least on the obtained current state data. In this example, next state data includes new values "D," "E," "F," and "G." In addition, last difference data ("C") is obtained (225) from the first memory buffer by using identifier Adr(C) stored in buffer 130b. Last difference data is then stored (230) in the second memory buffer, currently buffer 130b, as shown in FIG. 3E.

Figure 3F:
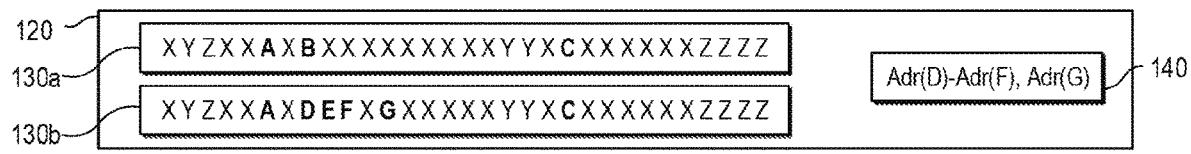

Next, as shown in FIG. 3F, new difference data ("D," "E," "F," and "G") is stored (235) in the second memory buffer, currently buffer 130b, and buffer 140 is updated (240) to store identifiers identifying the location of new difference data in the second memory buffer. In this example, the stored identifiers include a range identifier Adr(D)-Adr(F) and a specific identifier Adr(G). Next, if it is determined (245) that the next state is the final state, method 200 will end; otherwise, method 200 will continue to swap buffer (250) again, to obtain current state data (215), and so forth until the final state is reached.

According to the foregoing, example implementations disclosed herein enable a computing device to update a system's state data in a manner that maintains data coherency without requiring storing the entire state data at each state transition, thereby increasing system performance, reducing power consumption, reducing system cost, etc.

What is claimed is:

1. A system comprising:
a processor including one or more electronic circuits to:
initialize a first memory buffer and a second memory buffer with initial state data;
determine a next state data based on non-state data inputs and a portion of current state data, the next state data relating to a time period after a current point in time reflected by the current state data; and
store in the second memory buffer a new difference data representing differences between the next state data and the current state data.

2. The system of claim 1, further comprising the processor to store in the second memory buffer a last difference data representing differences between a last state data and the current state data.

3. The system of claim 1, wherein the non-state data inputs include user inputs and real-time sensor inputs.

4. The system of claim 1, wherein the first and the second memory buffer are stored on a device separate from the system and are remotely accessible by the system.

5. The system of claim 1, wherein the first memory buffer is stored over a plurality of devices separate from the system and is remotely accessible by the system.

6. The system of claim 1, wherein the second memory buffer is stored over a plurality of devices separate from the system and is remotely accessible by the system.

7. The system of claim 1, wherein the first memory buffer is a one-dimensional buffer and wherein the second memory buffer is a one-dimensional buffer.

8. A non-transitory machine-readable medium storing instructions executable by a processing resource to:
initialize a first memory buffer and a second memory buffer with an initial state data;
determine a next state data based on new difference data representing differences between a current state data and the next state data, the next state data relating to a time period after a current point in time reflected by the current state data; and store in the second memory buffer a last difference data representing differences between a last state data and the current state data.

9. The non-transitory machine-readable medium of claim 8, further including instructions to update a difference data identifier based on the new difference data.

10. The non-transitory machine-readable medium of claim 9, wherein the difference data identifier identifies regions or addresses of the first memory buffer and the second memory buffer where data is stored.

11. The non-transitory machine-readable medium of claim 8, further including instructions to update a difference data identifiers buffer before the last difference data is stored in the second memory buffer.

12. The non-transitory machine-readable medium of claim 8, further including instructions to store a difference data identifier in a difference data identifiers buffer, wherein the difference data identifiers buffer is stored on a separate device remotely accessible by the non-transitory machine-readable medium.

13. The non-transitory machine-readable medium of claim 8, wherein initializing the first memory buffer and the second memory buffer with initial state data comprises storing in each respective memory buffer identical initial state data including a plurality of predetermined values.

14. A method comprising:

storing a portion of a current state data in a first memory buffer;

determining a next state data based on a difference data representing differences between the current state data and the next state data, the next state data relating to a time period after a current point in time reflected by the current state data;

storing a last difference data representing differences between a last state data and the current state data in a second memory buffer;

storing a new difference data representing differences between the next state data and the current state data in the second memory buffer; and updating a difference data identifier based on the new difference data.

15. The method of claim 14, further comprising updating the difference data identifier based on the new difference data after storing the last difference data in the second memory buffer.

16. The method of claim 14, further comprising storing a difference data address in the first memory buffer and obtaining the difference data address from the first memory buffer.

17. The method of claim 14, further comprising obtaining inputs before the next state data is determined.

18. The method of claim 14, obtaining the last difference data from the second memory buffer.

* * * * *